United States Patent [19]

Levy et al.

[11] Patent Number: 4,579,455

[45] Date of Patent: Apr. 1, 1986

[54] PHOTOMASK INSPECTION APPARATUS AND METHOD WITH IMPROVED DEFECT DETECTION

[75] Inventors: Kenneth Levy, Saratoga; Steve Buchholz, San Jose; William H. Broadbent, Sunnyvale; Mark J. Wihl, San Jose, all of Calif.

[73] Assignee: KLA Instruments Corporation, Santa Clara, Calif.

[21] Appl. No.: 492,658

[22] Filed: May 9, 1983

[51] Int. Cl.[4] ................... G01B 11/00; H04N 7/18; H04N 7/00

[52] U.S. Cl. ................... 356/394; 356/398; 358/101; 358/106

[58] Field of Search ............. 356/394, 398; 358/106, 358/101; 371/68

[56] References Cited

U.S. PATENT DOCUMENTS

| | | | |
|---|---|---|---|
| 4,247,203 | 1/1981 | Levy et al. | 356/398 |
| 4,345,312 | 8/1982 | Yasuye et al. | 358/106 |
| 4,347,001 | 8/1982 | Levy et al. | 356/398 |

Primary Examiner—R. A. Rosenberger
Assistant Examiner—Crystal Cooper
Attorney, Agent, or Firm—Claude A. S. Hamrick

[57] ABSTRACT

Apparatus 20 for inspecting photomasks 26 and the like by comparison of duplicate die patterns, including improved defect detection. Two-dimensional pixel representations of two die patterns are formed, with pixels having values or black or white or shades or grey, depending upon the features of the die patterns. Defects in the die patterns are found by a defect detector circuit 60 at points of non-agreement between the pixel representations. Two window matrices 130 and 134 of adjacent pixels are defined for corresponding areas of the two die patterns. The center matrix of each window matrix is defined as a comparison matrix 132 and 136. An error value is computed for subsets of the window matrix by summing the squares of the differences between each of the pixel values of each subset and the corresponding pixel values of the opposite comparison matrix. If there is no defect and any misalignment between the two representations minimal, at least one error value will be less than a threshold error value. If none of the error values are less than the threshold error value, a defect is assumed. The magnitude of the threshold error value is automatically varied according to the number and type of edges within the window matrices to compensate for edge quantization errors of less than one pixel.

17 Claims, 16 Drawing Figures

FIG_3

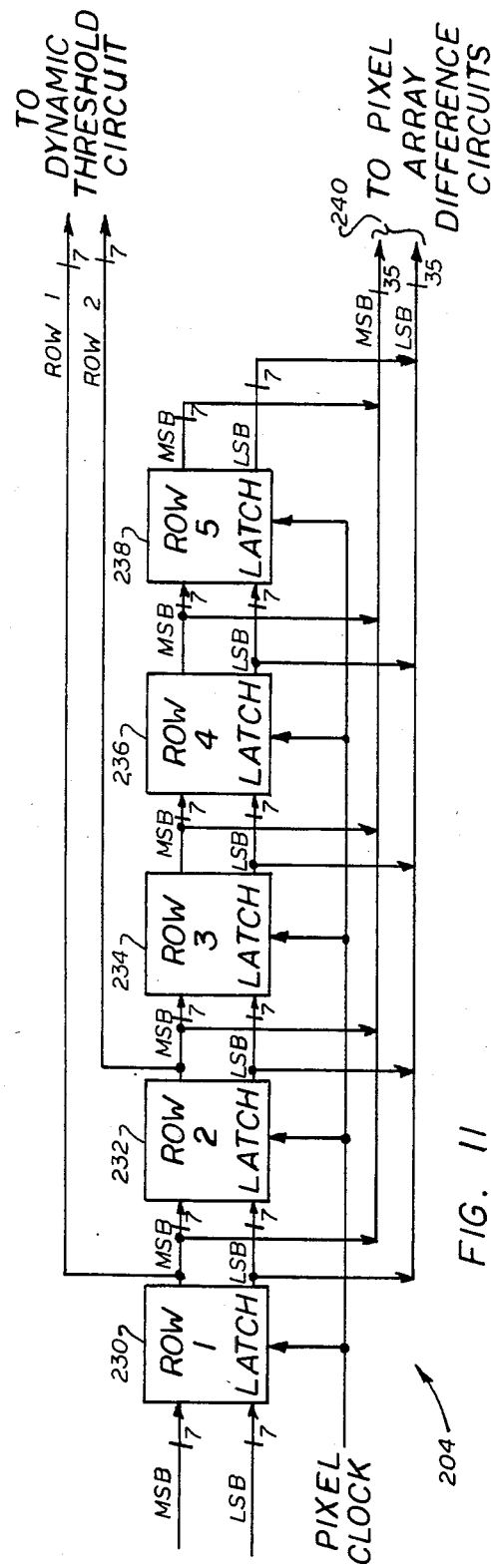
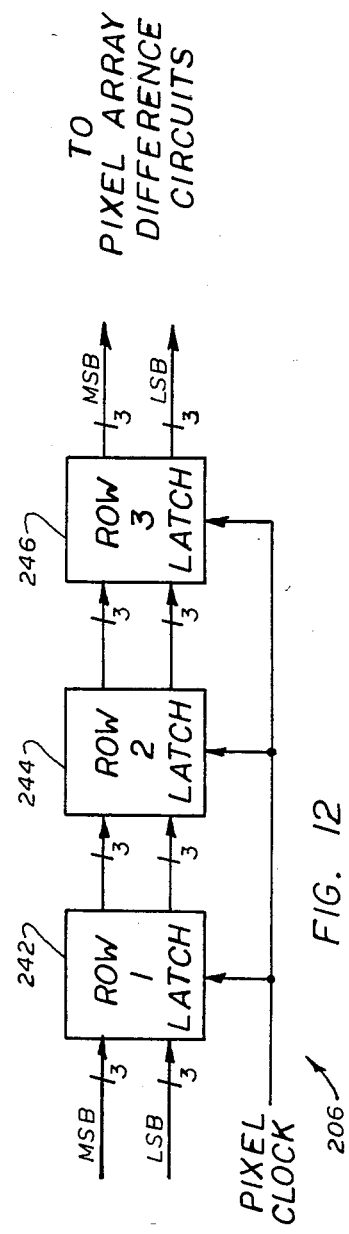
FIG. 11
FIG. 12

PHOTOMASK INSPECTION APPARATUS AND METHOD WITH IMPROVED DEFECT DETECTION

BACKGROUND OF THE INVENTION

A. Field of the Invention

This invention relates generally to object inspection apparatus, and relates more particularly to an apparatus and a method for inspecting photomasks having duplicate die patterns thereupon for defects by utilizing an area subtraction technique to identify defects as differences between otherwise duplicate die patterns.

B. Description of the Prior Art

Automatic photomask inspection systems have been commercially available for a number of years. Two such systems are shown in U.S. Pat. No. 4,247,203 issued Jan. 27, 1981 to K. Levy and P. Sandland and entitled "Automatic Photomask Inspection System and Apparatus," and U.S. Pat. No. 4,347,001 issued Aug. 31, 1982 to K. Levy and P. Sandland and also entitled "Automatic Photomask Inspection Systems and Apparatus." The machines disclosed in these patents found defects by comparing digitized images of two adjacent die patterns and recognizing differences between the two as defects. One drawback to the photomask inspection systems disclosed in the Levy patents is that the efficiency of the defect detection circuitry was poor for defects located near corners and on diagonal lines.

Photomask inspection systems that form pixel images of a photomask to be inspected are known in the prior art. For example, the Levy patents, listed above, disclose a system that optically projected an image of two die patterns onto photosensitive sensors. The sensors were scanned periodically as the photomask moved to form a two-dimensional pixel representation of the die patterns. These pixel representations were stored in digital form and processed by defect detection circuitry to locate and identify defects.

One method of processing such two-dimensional pixel representations of die patterns would be to first formulate and store both pixel representations in their entirety in a memory, then to shift the pixel representations to correct for alignment errors, and then to perform a comparison between the two pixel representations to identify regions where they do not match. A significant drawback to this method is the huge memory that would be required for the billions of bits of information necessary to represent die patterns with sufficient precision for state-of-the-art integrated circuits.

Another method of processing two-dimensional pixel representations of die patterns to determine defects would use a computer to process the sensor outputs as they are generated by the sensors. While this method would substantially reduce the memory requirements as compared to the method mentioned immediately above, the execution time of the programmed instructions necessary to process the sensor data would be prohibitively lengthy.

SUMMARY OF THE PRESENT INVENTION

It is therefore a principal object of the present invention to provide an improved apparatus for inspecting photomasks and the like with an improved defect detection apparatus and method.

It is another object of the present invention to provide an improved apparatus and method for quickly and efficiently detecting defects in duplicate die patterns of a photomask by aligning and comparing pixel representations of the die patterns in real time.

It is a further object of the present invention to provide an electronic circuit for defect detection that concurrently processes pixel representations of the die patterns as they are formed.

It is another object of the present invention to provide a defect detection apparatus and method having improved defect detection efficiency by reducing undetected defects and reducing falsely detected defects.

It is still another object of the present invention to provide a defect detection apparatus and method that permits misalignment of plus or minus two pixels between pixel representations of duplicate die patterns without missing defects or producing false detections.

It is an additional object of the present invention to provide a defect detection apparatus and method using area subtraction between pixel representations of duplicate die patterns that includes an adaptive error threshold to maximize detection sensitivity in the presence of errors due to edge effects.

It is a further object of the present invention to provide a defect detection apparatus and method with means for selectively adjusting the defect detection sensitivity to reduce errors due to falsely detected defects.

It is a still further object of the present invention to provide a defect detection apparatus and method using a comparison algorithm that reduces errors due to edge effects by weighting error magnitudes.

These and other objects, which will hereinafter become apparent, are accomplished in accordance with the illustrated preferred embodiment of the present invention by providing an inspection system including carriage means, illumination means, optical means, detector means, and signal processing means. The illumination means illuminates a photomask to be inspected, while the optical means projects images of two duplicate die patterns of the photomask onto a one-dimensional multi-element detector means. The carriage means moves the photomask at a constant velocity in a direction normal to the length of the detector means to allow the detector means to sequentially view the entire area to be inspected. The detector means is responsive to the intensity of light incident thereupon and simultaneously generates a plurality of signals that correspond to discrete areas of the photomask and the patterns contained in the images.

Signal processing means is provided for processing the signals of the detector means to detect the presence of defects. Included in the signal processing means are pixel memories, a defect detection circuit, timing circuits, a microprocessor, and input and output devices. By periodically scanning the detector means, two-dimensional representations of the die patterns are formed. Digitizers convert the analog signals of the detector means into digital values which are stored temporarily in two pixel memories. Stored at each location in the pixel memories is a pixel value that represents the intensity of light transmitted by a particular area of the photomask. Pixel values range from a minimum value which indicates the absence of light impinging upon a sensor and indicates the presence of a pattern feature at the particular area of the photomask, to a maximum value which indicates the full intensity of light impinging upon the sensor and the absence of a pattern feature. Intermediate pixel values indicate a pattern edge within the particular area of the photomask. To minimize the memory requirements, the pixel memories hold pixel values for only a small number of scans. As the pixel values are shifted through the pixel memories, a defect detector circuit analyzes groups of pixels representing corresponding areas of the two die patterns. Areas of the photomask where defects are indicated by the defect detector circuit are noted and are recorded on magnetic tape or other storage media for later use in photomask visual inspection and repair.

Defects are detected by a process of area subtraction between portions of the pixels representing the two die patterns. Two square window matrices of seven rows and seven columns of adjacent pixels are defined for corresponding areas of the two die patterns. The center three-by-three matrix of each window matrix is defined as a comparison matrix. Each window matrix has twenty five unique subsets of three-by-three adjacent pixels within its boundaries; one in the center plus twenty-four others that are offset by one or two pixels from the center in one or both directions.

The process of area subtraction involves calculating an error value for each subset of each window matrix. The error value is computed for each subset by summing the squares of the differences between each of the nine pixel values of each subset and the corresponding pixel values of the opposite comparison matrix. If there is no defect and any misalignment between the two representations is less than two pixels in magnitude, at least one error value will be less than a threshold error value. If none of the twenty five error values relating to one comparison matrix are less than the threshold error value, a defect is assumed to be located within that comparison matrix or within the opposite window matrix. The magnitude of the threshold error value is automatically varied according to the number of edges within the window matrices to compensate for errors caused by the different qualitization of edges.

Among the numerous advantages of the present invention is that it dynamically and accurately inspects the photomask by identifying defects, without requiring two perfectly aligned pixel representations. Another advantage of the present invention is that the sensitivity level of the defect detection circuit is adaptive so as to improve actual defect detection while reducing false defect detection.

These and other objects and advantages of the present invention will no doubt become apparent to those skilled in the art after having read the following detailed description of the preferred embodiment which is illustrated in the several figures of the accompanying drawing.

BRIEF DESCRIPTION OF THE DRAWINGS

FIG. 11 is a block diagram of a window matrix latch circuit utilized in the defect detection circuit of FIG. 8.

FIG. 12 is a block diagram of a comparison matrix latch circuit utilized in the defect detection circuit of FIG. 8.

DESCRIPTION OF THE PREFERRED EMBODIMENT

Figure 1:
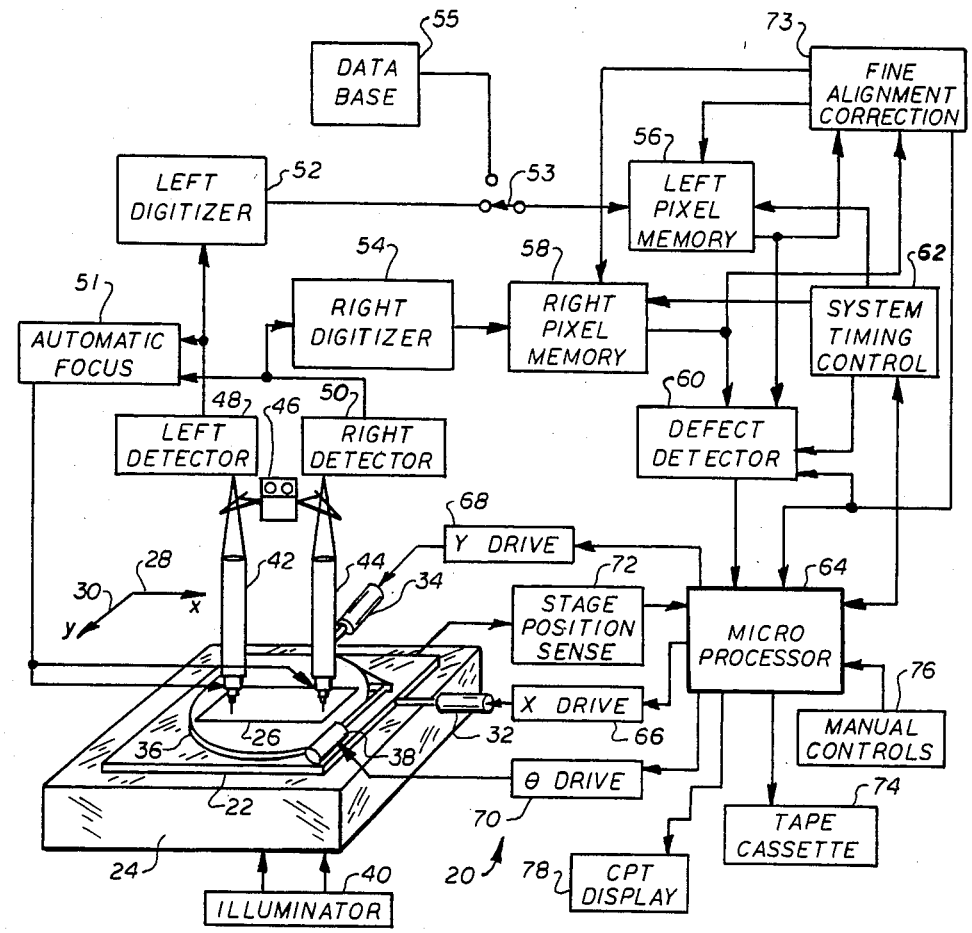
FIG. 1 is a functional block diagram of a photomask inspection apparatus, according to the present invention, for locating and recording areas of non-comparison between duplicate die patterns.

Referring now to FIG. 1 of the drawing, the preferred embodiment of a photomask inspection system according to the present invention is schematically illustrated at 20. The inspection system 20 includes an air-bearing stage 22 mounted on a granite table 24 for transporting and positioning a photomask 26 to be inspected. The stage 22 is movable in the X and Y directions 28 and 30, respectively, by motors that are schematically illustrated at 32 and 34, respectively. A photomask holder 36 is rotatable in the $\theta$ direction by a motor at 38. The photomask 26 to be inspected is mounted on photomask holder 36 which is rotated in the $\theta$ direction to align features of the photomask with the X and Y directions.

Photomask 26 is inspected for defects by comparing pixel representations of two duplicate die patterns of the photomask. Defects are identified at those locations where the two pixel representations do not match. The pixel representations are formed by a combination of optical and electronic means. The optical means includes an illuminator 40, disposed beneath the granite table 24, which illuminates the bottom of photomask 26 through an opening in table 24. Also included are left and right inspection optics 42 and 44, respectively, which project images of light transmitted through the transparent regions of the photomask onto a binocular view head 46, and onto left and right detectors 48 and 50, respectively. The binocular view head permits viewing of a magnified image of the photomask by an operator. The task of focusing images of the photomask onto left and right detectors 48 and 50 is performed by an automatic focus circuit 52, which responds to the output signals of the detectors. Left and right inspection optics 42 and 44 are positioned so as to focus identical portions of two die patterns of photomask 26 onto the respective left and right detectors.

The electronic means for forming pixel representations of the die patterns includes detectors 48 and 50, which generate analog voltage signals in proportion to the intensity of light impinging thereupon, and left and right digitizers 52 and 54, respectively, which convert the analog voltage signal from the detectors into digital signals. The digital signals forming the pixel representations of the die patterns are stored temporarily in left and right pixel memories 56 and 58, respectively. Alternatively, the data input to the left pixel memory 56 could be taken from a data base 55 which contains an electrically stored replica of the photomask or other object being inspected. An example of the use of a data base in a related system is disclosed in the co-pending U.S. Patent application of Danielson, Wihl, and Joseph, entitled "Reticle Inspection System" Ser. No. 474,461 filed Mar. 11, 1983, and assigned to the assignee of the present application.

Due to the enormous amount of memory that would othewise be required to store a complete pixel representation of the photomask 26, the inspection operation is continuously performed as the pixel representations are formed. Memories 56 and 58 are first-in-first-out (FIFO) type memory circuits that at any one point in time contain only a small fraction of the total pixel representations of the die patterns. In the preferred embodiment of the present invention, left and right pixel memories 56 and 58, respectively, contain pixel representations for the seven most recent scans of left and right detectors 48 and 50, respectively.

Digital data stored in the left and right pixel memories 56 and 58 are compared to each other by a defect detector 60 to locate defects in the die patterns of photomask 26. The speed of operation of the defect detector determines the throughput of the inspection apparatus 20, and thus its productivity. The operation of defect detector 60 will be described below in much greater detail. A system timing control circuit 62 provides timing signals to coordinate the sequences of the inspection process. Timing signals and defect results are respectively input to a microprocessor 64 by the system timing control and the defect detector.

Microprocessor 64 controls the position and movement of the air-bearing stage 22 through X, Y, and θ drives 66, 68, and 70, respectively, in response to program instruction and data received from a stage position sensor 72. In addition, a fine alignment correction circuit 73 which responds to data read out of memories 56 and 58 effects fine adjust of left and right pixel data to within plus or minus two pixels. 66, 68, and 70 are preferably motor controllers and sensor 72 is preferably an optical encoder. Inspection parameters may be prerecorded and input to microprocessor 64 via a tape cassette 74, or may be input manually through manual controls 76. Instructions to the operator or visual display of the photomask may be displayed on a CRT display 78. Defect data resulting from the inspection operation is output to the tape cassette. The design and operation of those features of the inspection apparatus 20 which are necessary for the formation of the pixel representations of the die patterns are described in U.S. Pat. No. 4,247,203 issued Jan. 27, 1981 to K. Levy and P. Sandland and entitled "Automatic Photomask Inspection System and Apparatus," and U.S. Pat. No. 4,347,001 issued Aug. 31, 1982 K. Levy and P. Sandland and also entitled "Automatic Photomask Inspection Systems and Apparatus," which are hereby incorporated by reference.

While the automatic focus circuit 52 maintains a focused image of the photomask 26 on the left and right detectors 48 and 50, the microprocessor 64 directs the X and Y drives 66 and 68 to move the stage 22 in a serpentine path so that the entire photomask area to be inspected is sequentially viewed by the detectors. The inspection operation occurs during X translations, when the stage 22 is moving at a constant velocity. Between X translations, the stage is indexed in the Y direction to reposition it for the next X translation. As a matter of convenience, features on the photomask that are parallel to the X direction are hereinafter referred to as horizontal, and features parallel to the Y direction are hereinafter referred to as vertical.

The image sensing elements of detectors 48 and 50 are preferably photosensors that are responsive to the intensity of light incident thereupon. Photosensors are dispersed at equally spaced positions along a line parallel to the Y direction. The size of the area of the photomask to which each photosensor responds is a function of the magnification of the inspection optics 42 and 44 and the size of the photosensors. At any one time, the photosensors of the left or the right detector view an area of the photomask that is one unit wide in the X direction and is N units long in the Y direction, where N equals the number of photosensors. By moving the stage 22 in the X direction at a constant velocity and by periodically scanning the analog output signals of the photosensors, a two-dimension representation of the photomask is formed.

If the photomask 26 and the inspection optics 42 and 44 are precisely aligned, then all photosensors of the left detector 48 and the right detector 50 will sense corresponding areas of their respective die patterns. If there is a misalignment in the Y direction, the effective result is that corresponding areas will be sensed, but by photosensors that are displaced in Y from the equivalently positioned photosensors. The effect of a misalignment in the X direction would be that corresponding areas will be sensed by equivalently positioned photosensors, but during an earlier or later scan.

The digitized sensor outputs for each scan are stored temporarily in the left and right pixel memories 56 and 58 to form the pixel representations of the die patterns. Each scan of the N photosensors of each detector defines one vertical column of each pixel representation. A pixel is the rectangularly shaped element of which the pixel representations are composed. Each pixel corresponds to a small rectangular area of the photomask. The Y dimension of each pixel is determined by the photosensor spacing and the optical magnification, while the X dimension is determined by the stage velocity in X and the frequency of scanning the outputs of the photosensors. Each pixel has an X and Y address corresponding to the X and Y coordinate location of the small rectangular area of the photomask that is viewed by its photosensor during the point in time when the photosensor output is scanned.

Each pixel has an associated pixel value that is proportional to the intensity of light incident upon its photosensor during the point in time when the photosensor output is scanned. In the preferred embodiment of the present invention, the analog output signals of the photosensors are digitized by digitizers 48 and 50 to one of four values: 3 (white), 2 (white-grey), 1 (black-grey), and 0 (black). White indicates that the photomask area imaged on the photosensor is transparent, which allows the full intensity of the illumination light to impinge upon the photosensor. Black indicates that an opaque area of the pattern completely blocks illumination light from reaching the photosensor. White-grey and black-grey indicate the presence of both transparent and opaque patterns within the area imaged on the photosensor, caused by the presence of one or more edges. A white-grey pixel value indicates that the photomask area that is imaged on the photosensor contains more transparent area than opaque area. A black-grey pixel value indicates more opaque area than transparent area in the photomask area imaged on the photosensor. Pixel values are stored as two binary digits (bits) in the left and right pixel memories 56 and 58 and in the defect detector 60. The most significant bit (MSB) of the pixel value indicates whether the pixel is white or nearly white (MSB=1) or black or nearly black (MSB=0).

Figure 2:
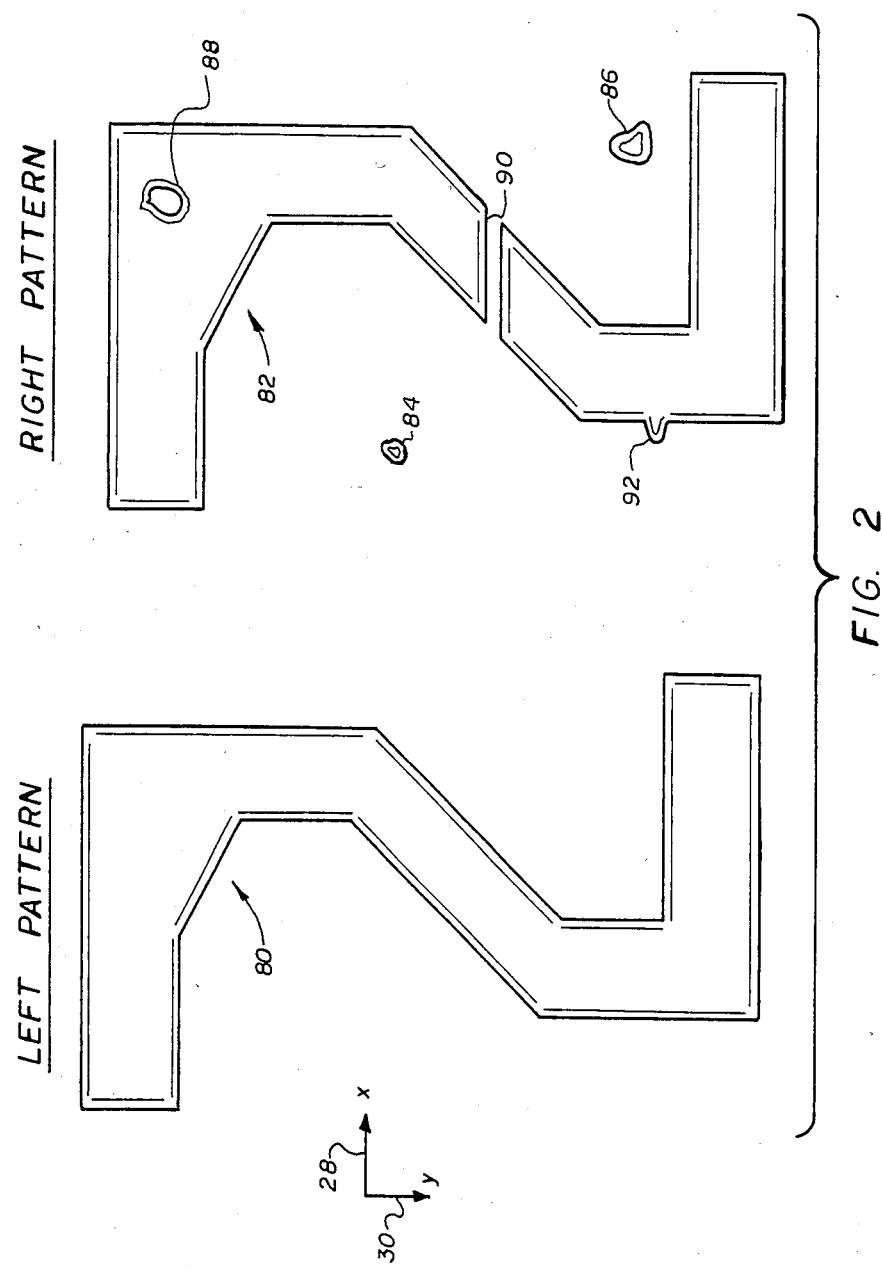
FIG. 2 is an enlarged plan view of two corresponding portions of two die patterns on a photomask to be inspected by the inspection apparatus of FIG. 1.

Defect detection by the inspection apparatus 20 involves the comparison of two duplicate die patterns. Defects are indicated in those areas where the die patterns do not match. In an example that is illustrated in FIG. 2, a left pattern 80 and a right pattern 82 are portions of duplicate die patterns, and have opaque regions on an otherwise transparent plate forming the photomask 26. Several defects exist in right pattern 82, including two spots 84 and 86 in the transparent region, a void 88 in the opaque region, a gap 90 across a diagonal feature, and a protrusion 92 from a vertical edge.

Figure 3:
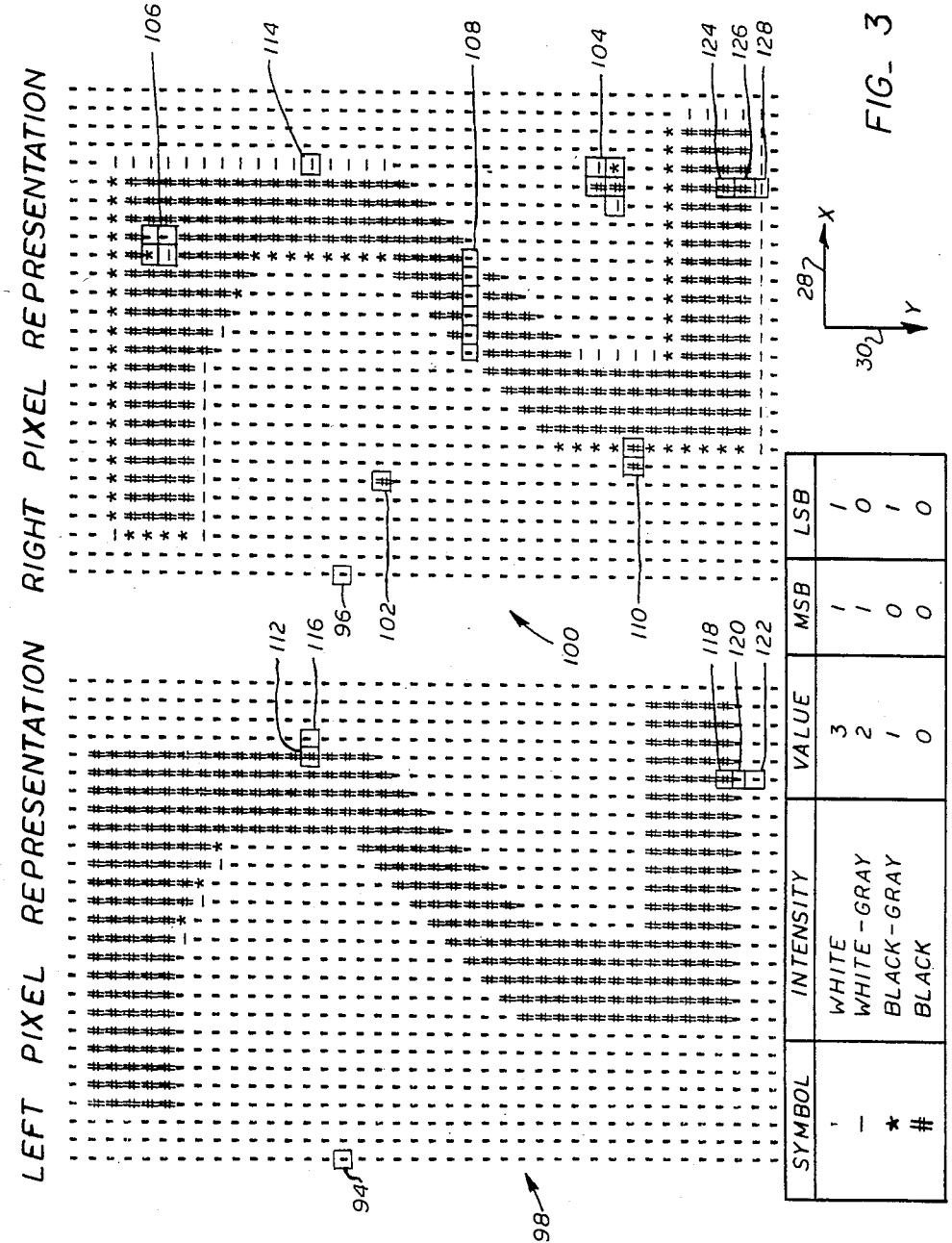
FIG. 3 is a diagram of a two-dimensional pixel representation of the two die patterns of FIG. 2, with each pixel having a value according to the table at the bottom of FIG. 3.

Complete two-dimensional pixel representations of left and right patterns 80 and 82 are shown in FIG. 3. Each pixel of the left and right pixel representations 98 and 100, respectively, has a pixel value as indicated by the symbol table of FIG. 3. Pixels 94 and 96, for example, both are white and have a value of 3, since both represent transparent areas of the left and right patterns. The pixel representations shown in FIG. 3 do not actually exist at any one time in the left and right pixel memories 56 and 58, since only pixel values from the seven most recent scans of the detectors 48 and 50 are stored. Rather, the pixel representations shown are composites of the digitized output signals of forty photosensors of the left detector 48 and forty photosensors of the right detector 50 during twenty-seven consecutive scans.

The defects in the right pattern 82 are indicated in the right pixel representation 100 as irregularities in pixel values as compared to the left pixel representation 98. Spot 84 is indicated by a black pixel 102 within a field of white pixels. Spot 86 is indicated by several adjacent black, black-grey, and white grey pixels 104 within a field of white pixels. Void 88 is indicated by white, white-grey, and black-grey pixels 106 within a field of black pixels. Gap 90 is indicated in the right pixel representation as a horizontal line of white pixels 108 across the diagonal feature formed by black pixels. Protrusion 92 is indicated by two black pixels 110 that extend from an otherwise black-grey edge.

If the left and right pixel representations were precisely aligned and if there were no differences due to quantization, then a simple pixel to pixel comparison would indicate all defects. In actuality, precise alignment of the pixel representations is not practical due to the necessarily small size of the pixels and quantization differences will be present since the data is spatially sampled. In the preferred embodiment of the present invention, pixel dimensions are on the order of one half micrometer to permit inspection of photomask geometries on the order of one and one-half micrometer. Vibration of the stage 22 and the objectives 42 and 44, and the die-to-die registration on the photomask as well as line width variations prohibit, as a practical matter, perfect alignment between pixel representations.

An example of a quantization error is shown in equivalently positioned pixels 112 and 114 in the left and right pixel representations 98 and 100 (FIG. 3). A vertical edge of the left pattern 80 is so positioned that it falls between pixel 112 and pixel 116, with the result that pixel 112 is black and pixel 116 is white. In the right pixel representation, however, the vertical edge falls within pixel 114, so its value is white-grey. Although pixels 112 and 114 do not agree in value, no defect exists.

Residual alignment errors of plus or minus two pixels may also occur where no defect is indicated. In the right pixel representation shown in FIG. 3, the die pattern is shifted downward relative to the left pixel representation by a distance slightly greater than one pixel. The lower horizontal edge of the left pixel representation is between pixels 118 and 120, while the lower horizontal edge of the right pixel representation is in pixel 128. A pixel to pixel comparison between the equivalently positioned pixels 118 and 124, 120 and 126, 122 and 128 would show disagreements between pixels 120 and 126, and between pixels 122 and 128, even though no defect is present. It is necessary, therefore, to provide means for compensating for such misalignment between pixel representations.

Figure 4:
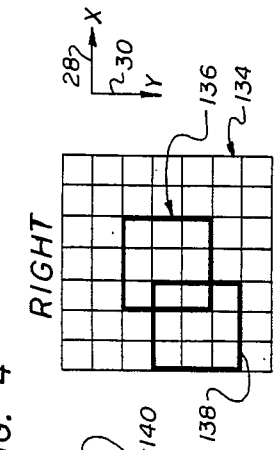
FIG. 4 is a diagrammatic representation of left and right window and comparison matrices and illustrates pixel labeling nomenclature.

Defect detector 60 compensates for alignment errors of up to two pixels in either or both the X and Y directions 28 and 30, while detecting defects by a comparison of equivalently positioned pixels. Left and right comparison matrices are defined as square matrices of adjacent pixels in three rows and three columns. The pixels of the left and right comparison matrices are equivalently positioned within the left and right pixel representations, that is they would be identical if the left and right pixel representations were perfectly aligned. Left and right window matrices are defined as square matrices of adjacent pixels in seven rows and seven columns having the left and right comparison matrices at the respective centers thereof. The left window matrix 130, with the left comparison matrix 132 at its center, and the right window matrix 134, with the right comparison matrix 136 at its center are illustrated in FIG. 4. FIG. 4 also illustrates the nomenclature used below in reference to the pixels of the window and comparison matrices. Pixels are referred to as L or R (indicating left or right representation), column number, and row number. The comparison matrices are located at the intersection of columns 3, 4, and 5 and rows 3, 4, and 5.

To compensate for alignment errors larger than one pixel in length, the defect detector circuit 60 compares each comparison matrix to all of the possible subsets of the opposite window matrix that are equal in size to the comparison matrix. Each window matrix has twenty-five unique subsets of adjacent pixels in three rows and three columns. One such subset of the left window matrix 130 is the left comparison matrix 132. Other subsets are shifted relative to the comparison matrix by either one or two pixels in either or both the X and Y directions. For example, the subset containing pixels L(1;1), L(1;2), L(1;3), L(2;1), L(2;2), L(2;3), L(3;1), L(3;2), and L(3;3) is shifted two pixels in the +X direction and two pixels in the +Y direction from the center of the window matrix.

Figure 5:
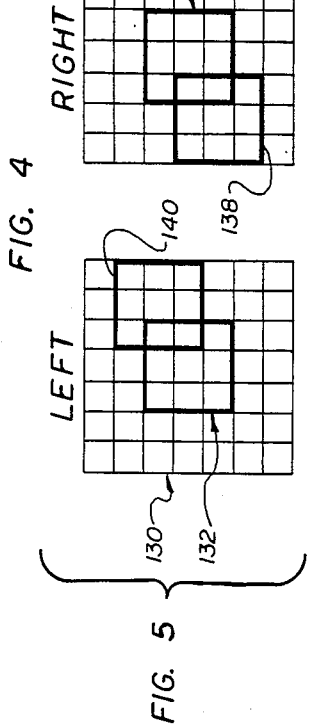
FIG. 5 is a diagrammatic representation of the matrices of FIG. 4 and illustrates misalignment compensation.

By comparing the comparison matrix of one side with all twenty-five subsets of the window matrix of the opposite side, the defect detector circuit compensates for alignment errors of up to two pixels in either or both the X or Y directions. If there were no quantization errors, then one of the twenty-five comparisons between the comparison matrix of one side and the subsets of the window matrix of the opposite side will yield an exact match, unless a defect is present within the comparison matrix. In the example shown in FIG. 5, there is an exact match between the left comparison matrix 132 and a subset 138 of the right window matrix 134. There is also an exact match between the right comparison matrix 136 and a subset 140 of the left window matrix 130. In this example, the right pixel representation is offset relative to the left pixel representation by two pixels in the +X direction and one pixel in the −Y direction.

To compensate for quantization differences, error threshold values are utilized in the comparison process. First, the defect detector circuit 60 computes an error value for each of the twenty-five comparisons between a comparison matrix and the subsets of the opposite window matrix. Then it compares each error value to an error threshold value, and if at least one error value is less than the error threshold value, no defect is indicated. By setting the error threshold value to a non-zero value, edge quantization effects are compensated for.

In the comparison process, an error value is computed for each of the twenty-five comparisons between a comparison matrix and the subsets of the opposite window matrix. One method of computing the error value is to sum the absolute values of the differences in pixel value between each pixel of the comparison matrix and the corresponding pixel of the subset. The magnitude of the error value computed according to this method is proportional to the number of pixels that disagree in value and is also proportional to the magnitude of the disagreement.

An alternative method of computing the error value is implemented in the preferred embodiment of the present invention. The preferable method of error value computation computes an error value by summing the squares of the differences between the pixel values of each pixel of the comparison matrix and its corresponding pixel of the subset. For example, the error value for the comparison between the right comparison matrix and the lower right subset of the left window matrix is as follows: $[L(1;1)-R(3;3)]^2+[L(1;2)-R(3;4)]^2+[L(1;3)-R(3;5)]^2+[L(2;1)-R(4;3)]^2+[L(2;2)-R(4;4)]^2+[L(2;3)-R(4;5)]^2+[L(3;1)-R(5;3)]^2+[L(3;2)-R(5;4)]^2+[L(3;3)-R(5;5)]^2$. An advantage to this alternative method is that edge quantization effects which tend to be small are less heavily weighted than are errors due to defects.

Edge quantization effects are manifested in the pixel representations by variations in the pixel values at edges of the die patterns. This is determined by where the edge strikes the sampling grid. An edge in one pixel representation may be represented, for example, by a row of pixels that are black, black, and white. The sampling and quantization process can, however, cause the same edge of the opposite pattern to be represented by a row of pixels that are black, black-grey, and white. For each pixel effected, the contribution of the edge effect to the error value is equal to the square of the difference in pixel values, $(1-0)^2$, which equals one. Assuming all three rows of the comparison matrix are black, black, and white, and all three rows of the closest matching subset are black, black-grey, and white, then the error value of this comparison is equal to three. When there is one edge in a window matrix, three pixels could each contribute a value of one to the minimum error value. In order to compensate for edge effects, therefore, the error threshold value is equal to three when one edge is within the window matrix. If, however, the minimum size of the geometry of the die patterns is not greater than the width of two pixels, then two edges could be present within a comparison matrix. It has been found that an error threshold value of six will compensate for quantization errors in such a case.

Similarly, when there is a corner within a window matrix, five pixels could each contribute to the minimum error value due to edge effects. It has been empirically determined that an error threshold value of eight is sufficient to screen the edge quantization effects due to corners. To compensate for corners, therefore, the error threshold value is preferably equal to eight when one vertical and one horizontal edge are within a window matrix.

Quantization errors are noticeable only at pattern edges, and are of no consequence in a clear field (no edges). To improve defect detection in clear fields, therefore, the defect detector circuit 60 adjusts the error threshold value to zero when no edges exist in a window matrix. This increases defect detection sensitivity since a defect that causes a minimum error value of one or more will be detected.

Figure 6:
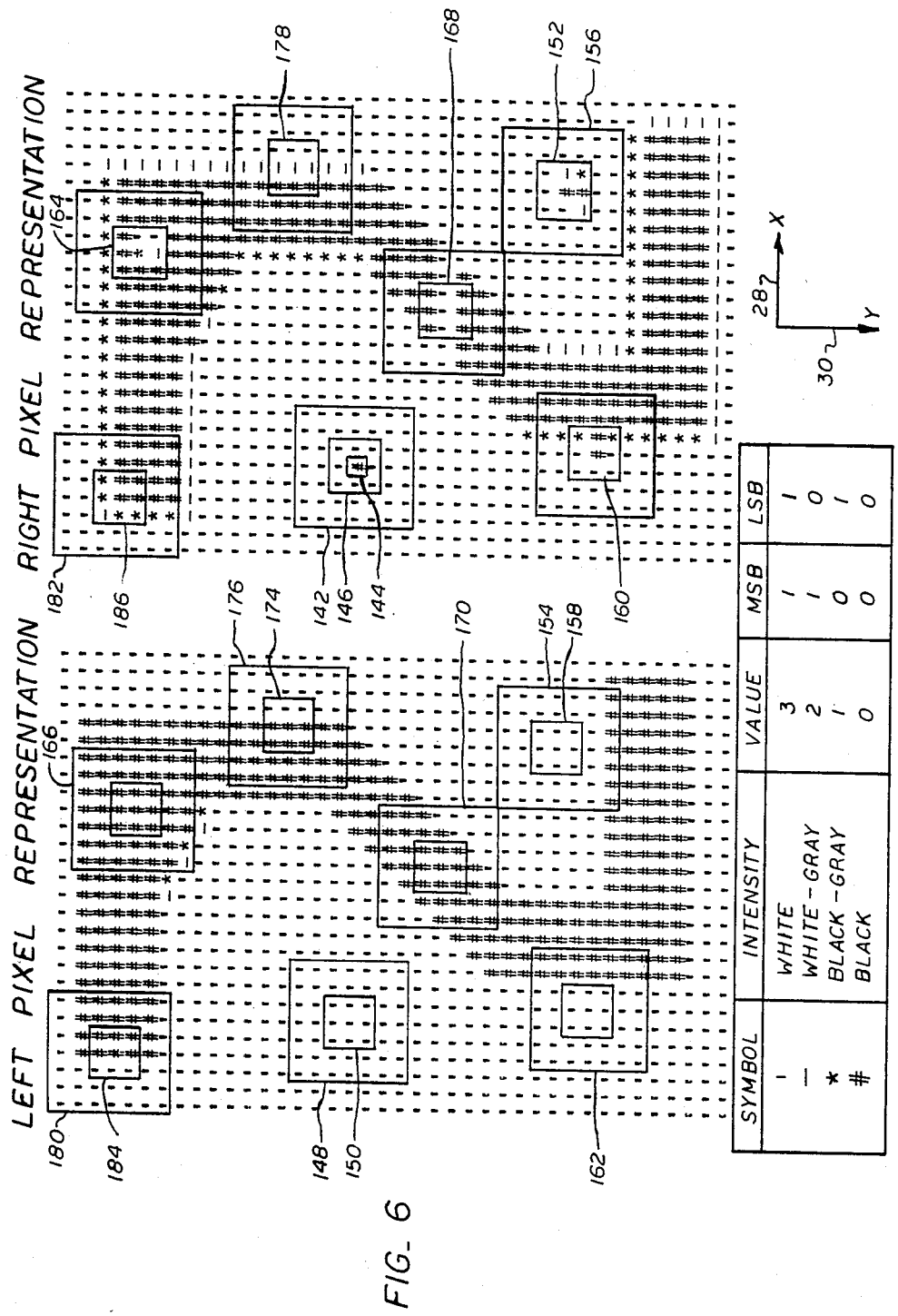
FIG. 6 is a diagram of a two-dimensional pixel representation of the two die patterns of FIG. 2 and illustrates the relative positioning of left and right window and comparison matrices.

In FIG. 6, for example, a right window matrix 142 has one black pixel 144 that represents spot 84 (FIG. 2). To detect this defect, the right comparison matrix 146 is compared to each subset of left window matrix 148. Since all of the pixels of the left window matrix are white [value=3], and one of the pixels of the right comparison matrix is black [value=0], each comparison will yield an error value equal to nine [$(30)^2$]. Nine is greater than the error threshold value for clear fields, therefore, a defect is detected within the right comparison matrix 146.

The presence of spot 84 does not cause a defect to be detected in the left pixel representation, even though the left and right pixel representations do not match. To determine whether a defect exists within the left comparison matrix 150, it is compared to all twenty-five subsets of the right window matrix 142. Although nine of the subsets contain the black pixel 144 and do not match with the left comparison matrix, the remaining sixteen subsets do match. Since there is a match between the left comparison matrix 150 and at least one subset of the right window matrix 142, no defect is detected.

The defect caused by spot 86 is detected in a similar manner. Right comparison matrix 152 is compared against all subsets of its corresponding left window 154. No subsets of the left window matrix 154 exactly matches the pixel values of the right comparison matrix. The minimum error value is found at any of the five subsets in rows 1, 2, and 3. R(3;3) is black-grey and contributes a value of one to the error value. R(5;3) is white-grey and contributes a value of four. R(3;4) is white-grey and contributes a value of one. R(4;4) is black and contributes a value of nine. R(4;3), R(5;4), R(3;5), R(4;5), and R(5;5) all match their corresponding subset pixel values and contribute zero. The minimum error value of right comparison matrix 152 is therefore equal to fifteen. Left window matrix 154 has one horizontal line therein, so the error threshold value is equal to six. Clearly the minimum error value of the right comparison matrix 152 exceeds the error threshold value, thus indicating a defect within matrix 152.

Although the left window matrix 154 has an edge therein, the corresponding right window matrix 156 does not, however the defect has created vertical and horizontal edges so the threshold is set to eight. Even so, no defect is indicated within the left comparison matrix 158 because it matches exactly with several subsets of the right window matrix 156.

In a similar fashion, protrusion 92 is detected as a defect within right comparison matrix 160. The minimum error value found in comparing the right comparison matrix 160 to the twenty-five subsets of its corresponding left window matrix 162 is equal to eleven, which clearly exceeds the error threshold value for one edge and indicates a defect.

The presence of a defect caused by void 88 is detected within right comparison matrix 164. In the comparison between the right comparison matrix 164 and its corresponding left window matrix 166, the minimum error value is equal to twenty-three. Since the lower left pixel of the left window matrix, L(7;1), is white-grey, there is a corner within the left window matrix. Accordingly, the error threshold value for the left window matrix is equal to eight. The minimum error value of the right comparison matrix 164 is far in excess of the error threshold value, thus indicating the defect.

Similarly, the defect caused by gap 90 is detected within right comparison matrix 168 when it is compared to the subsets of its corresponding left window matrix 170. The minimum error value from the comparison is found to be twenty-seven, again exceeding the error threshold value of eight and indicating a defect within the right comparison matrix.

Although the right pixel representation is shifted slightly in the −X direction with respect to the left pixel representation due to quantization, this misalignment is not detected as a defect. The right comparison matrix 172 has three rows of pixels with values of black, white-grey, and white, indicating a vertical edge within column four. The corresponding left comparison matrix 174 has three rows of pixels with values of black, black, and white, indicating a corresponding vertical edge between columns three and four. Comparing the right comparison matrix to the subsets in columns two, three, and four of the left window matrix 176, yields a minimum error value of three, and thus no defect. Comparing the left comparison matrix to the subsets in columns four, five, and six of the right window matrix 178, also yields a minimum error value of three and, therefore, no defect is indicated.

The upper left corner of the pattern is an example of an edge effect causing a minimum error value equal to eight in the absence of any defects. The edges of the corner are represented within the left window matrix 180 as sharp black to white transitions. Within the right window matrix 182, however, the edges are black-grey with a white-grey corner pixel. The minimum error value found in the comparison of the left comparison matrix 184 to the subsets of the right window matrix 182 is equal to three. The comparison of the right comparison matrix 186 to the subsets of the left window matrix 180 yields a minumum error value of eight, since pixels R(5;3), R(5;4), R(4;5) and R(3;5) have contributions of one and pixel R(5;5) has a contribution of four. By setting the error threshold value equal to eight in this case, false defect detection is avoided.

As stated above, the pixel representations shown in FIGS. 3 and 6 do not actually exist at any one time in the left and right pixel memories 56 and 58, since only pixel values from the seven most recent scans of the detectors 48 and 50 are stored. Defect detection is continuously performed by the defect detector circuit 60 on the pixel representations of the seven most recent scans of the output signals of left and right detectors 48 and 50. Each pulse of a pixel clock advances the left and right comparison and window matrices by one row of pixels in the +Y direction. During the time between pulses of the pixel clock, the defect detector determines whether a defect exists within either the left or the right comparison matrix. This process continues throughout each scan until the window matrices reach the +Y limit of the pixel representations. A new scan is then begun with the oldest scan line dropped off and the newest added; the comparison and window matrices are repositioned at the top of the pixel representations. Each pixel is utilized in the defect calculations a total of forty-nine times, during seven consecutive scans. Each pixel is utilized as a comparison pixel a total of nine times, during the middle three of the seven consecutive scans.

Figure 7:
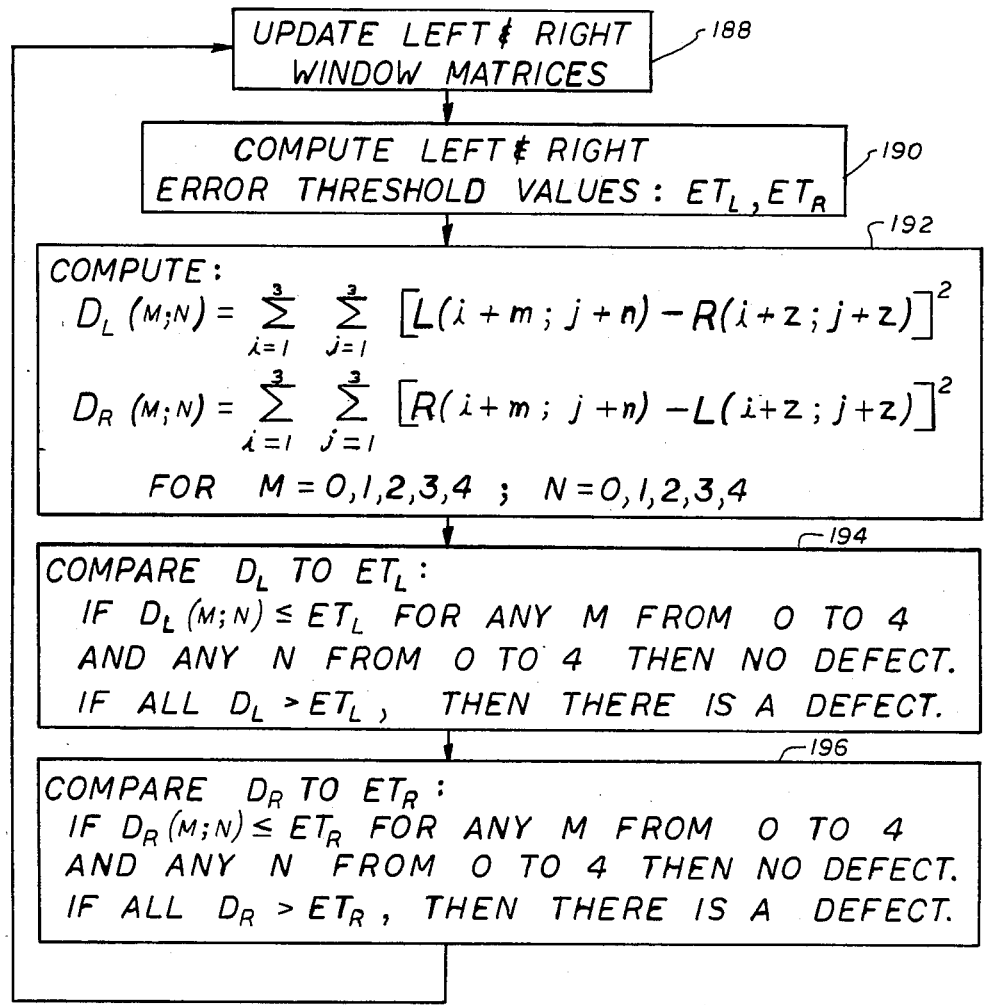
FIG. 7 is a flow chart that illustrates the operation of the defect detection circuit.

FIG. 7 is a flow chart that generally illustrates the operation of the defect detection circuit 60. Upon a pulse from the pixel clock line, the left and right window matrices are updated at 188. Next, error threshold values, $ET_l$ and $ET_r$, are computed for the left and right window matrices at 190. $ET_l$ and $ET_r$ are functions of the number of horizontal and vertical edges within their respective window matrices. The next step, at 192, is to compute the error values, $D_l$, of the right comparison matrix with each of the twenty-five subsets of the left window matrix and the error values, $D_r$, of the left comparison matrix with each of the twenty-five subsets of the right window matrix. Each error value is equal to the sum of the squares of the differences between each of the nine corresponding pairs of pixels. The next step, at 194, is to compare each of the twenty-five $D_l$ values to $ET_l$, and if none are less than $ET_l$, then a defect exists. It is not always possible to determine which side is defective. Next, at 196, the twenty-five $D_r$ values are compared to $ET_r$, and if none are less than $ET_r$, then a defect exists. Finally, the pixel clock pulses once again, returning execution to the top of the flow chart.

Figure 8:
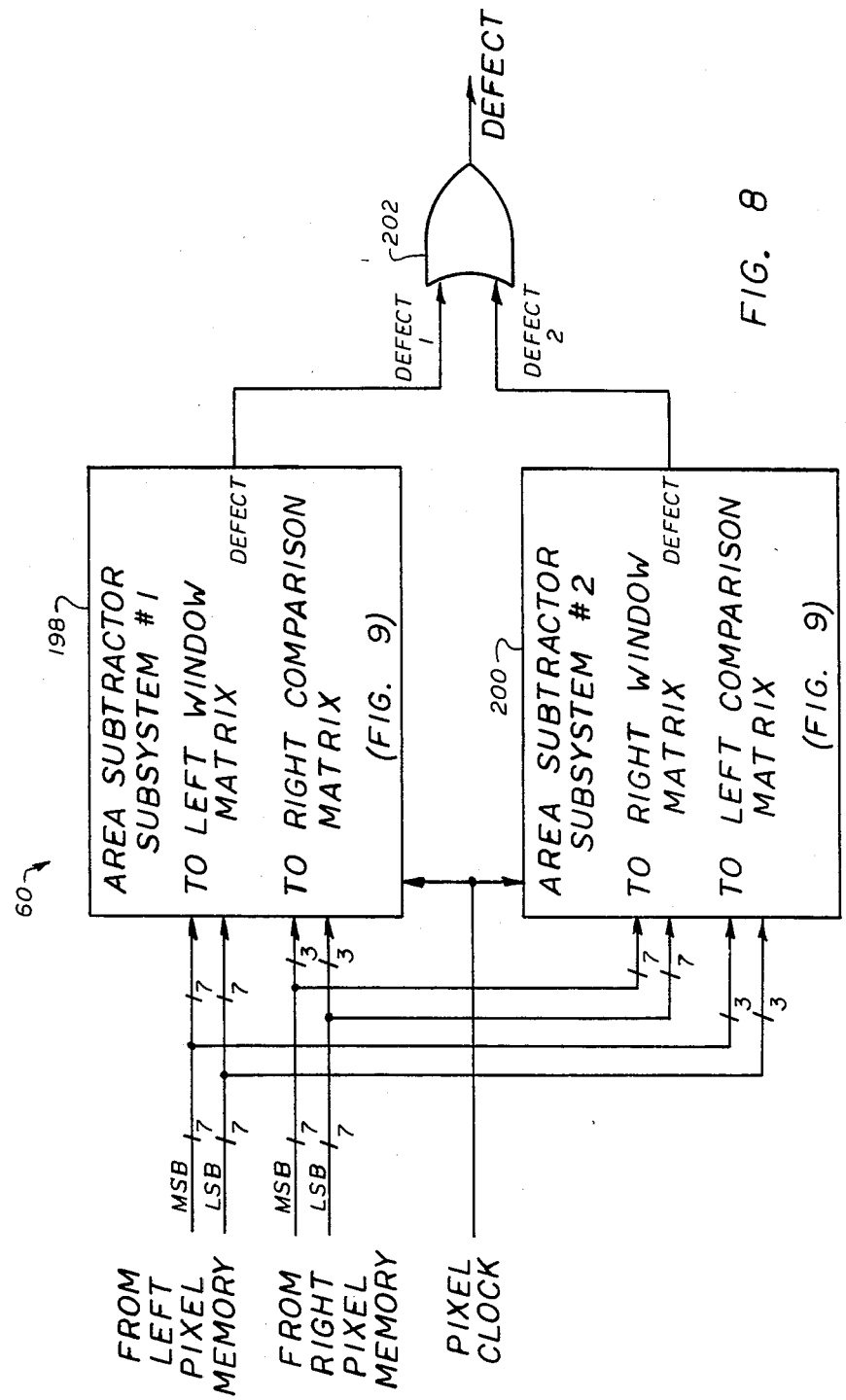
FIG. 8 is a block diagram of the defect detection circuit utilized in the inspection apparatus of FIG. 1.

FIGS. 8, 9, 11, 12, 13, and 14 describe the implementation of the defect detector 60 in detail. FIG. 8 illustrates the division of the defect detector circuit into a first area subtractor subsystem 198 for detecting defects in the right comparison matrix, and a second area subtractor subsystem 200 for detecting defects in the left comparison matrix. During each pixel clock cycle, one row of pixel values is input from both the left and right pixel memories 56 and 58. Each pixel is represented by a two bit binary number having a most significant bit (MSB) and a least significant bit (LSB). From the left pixel memory, seven pixel values are input to the first area subtractor 198 and three pixel values, centered within the seven pixels, are input to the second area subtractor 200. Similarly, from the right pixel memory, seven pixel values are input to the second area subtractor and the middle three pixel values are input to the first area subtractor. The pixel clock is input to both first and second area subtractors from the system timing control 62. If a defect is indicated by either the first or the second area subtractor subsystem, OR gate 202 indicates a defect to the microprocessor 64.

Figure 9:
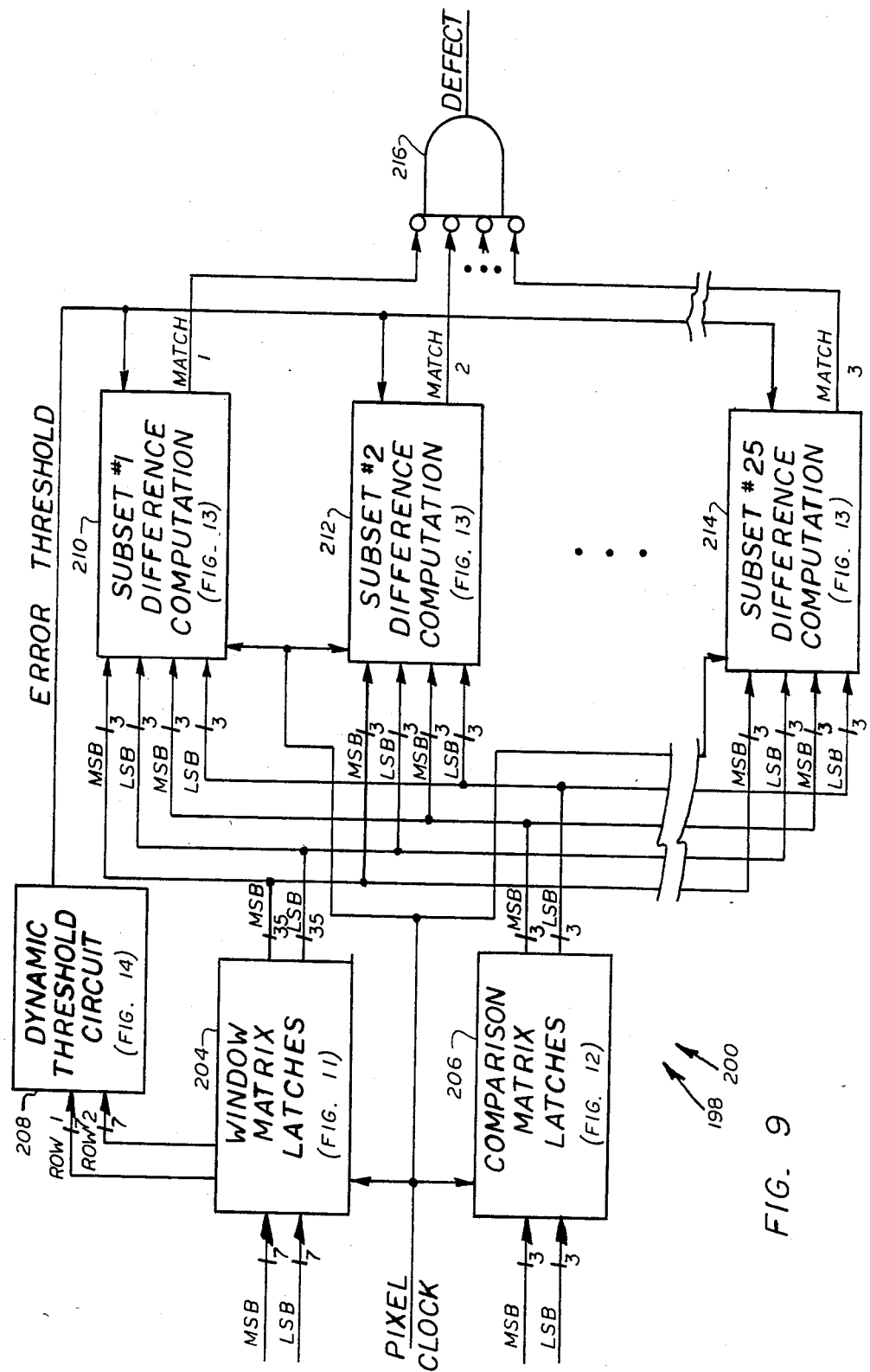
FIG. 9 is a block diagram of an area subtractor portion of the defect detection circuit of FIG. 8 which determines the existence of a defect within a comparison matrix.

FIG. 9 illustrates the circuit of the first and second area subtractor subsystems 198 and 200. Both area subtractor circuits are identical with the exception of the source of the pixel value data. During each period of the pixel clock, the area subtractor circuits 198 and 200 perform the functions listed in the flow chart of FIG. 7. Each area subtractor circuit computes an error threshold value according to the number of edges in the appropriate window matrix, computes error values for each subset of the window matrix in comparison to the opposite comparison matrix, and indicates the existence of a defect if all error values exceed the error threshold value. Each area subtractor circuit includes window matrix latches 204 for temporarily storing pixel values of the window matrix, comparison matrix latches 206 for temporarily storing pixel values of the opposite comparison matrix, dynamic threshold circuit 208 for determining the magnitude of the error threshold value as a function of the number of horizontal and vertical edges within the window matrix, subset difference computation circuits 210, 212, and 214 for calculating error values for each subset with respect to the comparison matrix and for comparing the error values to the error threshold value, and an AND gate 216 for summing the results of the difference computation circuits. The subset difference computation circuits are twenty-five in number, and are wired in parallel to permit simultaneous error computation in all twenty-five subsets. Window matrix latches 204, comparison matrix latches 206, subset difference computation circuits 210, 212, and 214, and dynamic threshold circuit 208 are all described below in greater detail in relation to FIGS. 11, 12, 13, and 14, respectively.

Figure 10:
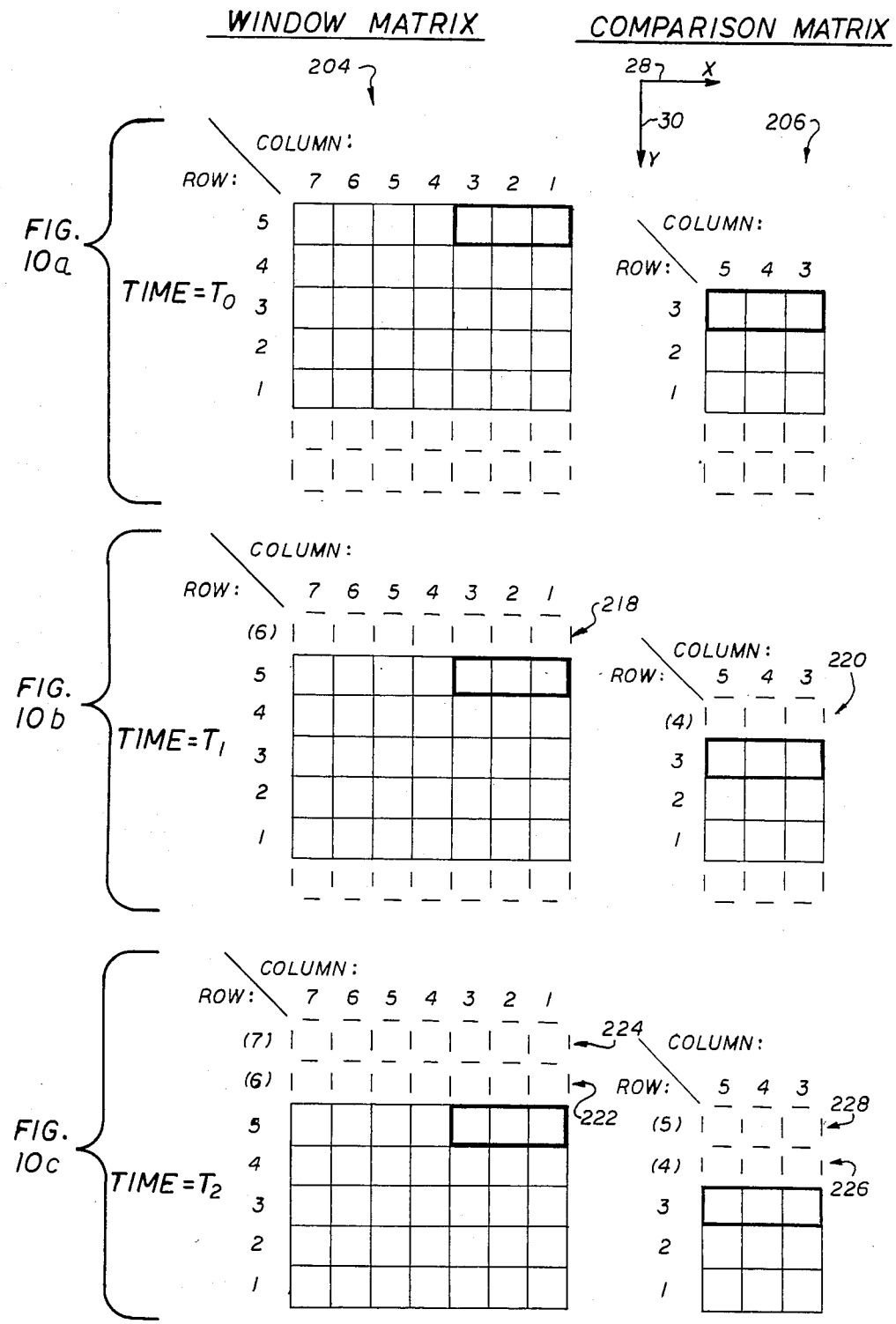
FIG. 10a, 10b, and 10c are diagrammatic representations of the window and comparison matrices at three consecutive points in time.

In order to simplify the area subtractor circuits 198 and 200, the computation of the error values for each comparison of a comparison matrix and the subsets of its opposite window matrix occurs over three clock cycles. FIG. 10 illustrates the method utilized to temporarily store the pixel values of a window matrix and a comparison matrix. The latches 204 of the window matrix are operable for storing seven columns and five rows of pixels. The latches 206 of the comparison matrix are operable for storing three columns and three rows of pixels. Upon each pixel clock pulse, the window matrix latches 204 clears the pixel values of row five, sequentially shifts the pixels of row four to row five, the pixels of row three to row four, the pixels of row two to row three, the pixels of row one to row two, and loads seven new pixel values from one pixel memory into row one. In addition, upon each pixel clock pulse, the comparison matrix latches 206 clears the pixel values of its row three, shifts the pixels of row two to row three and the pixels of row one to row two, and loads three new pixel values from the other pixel memory into row one. The three pixels loaded into row one of the comparison matrix latches are positioned in columns three, four, and five of its companion window matrix. Conversely, the pixels in columns three, four, and five and in row one of the window matrix latches are simultaneously loaded into the comparison matrix latches of the opposite area subtractor circuit.

FIG. 10 illustrates the window matrix latches 204 and the comparison matrix latches 206 at three consecutive points in time. At time=$t_0$, the latches are as shown in FIG. 10a. At time=$t_1$, row five of the window matrix at $t_0$ has been shifted out and is located at 218, shown in FIG. 10b in phantom lines as row six. Also at time=$t_1$, row three of the comparison matrix at $t_0$ has been shifted out and is located at 220, shown in phantom lines as row four. At time=$t_2$, in FIG. 10c, row five of the window matrix at $t_1$ has been shifted out and is located at 222, shown in phantom lines as row six, and row six at $t_1$ is shown at 224 in phantom lines as row seven. Also at time=$t_2$, row three of the comparison matrix at $t_1$ has been shifted out and is located at 226, shown in phantom lines as row four, and row four at $t_1$ is shown at 228 in phantom lines as row five.

The previously described seven by seven window matrix is represented at $t_2$ by the five rows of the window matrix latches 204, plus the phantom rows six and seven. Similarly, the previously described three by three comparison matrix is represented at $t_2$ by row three of the comparison matrix latches 206, plus the phantom rows four and five. Note that the phantom row seven of the window matrix is equal to row five of the window matrix latches at $t_0$ and that the phantom row is six is equal to row five of the window matrix latches at $t_1$. Also note that the phantom row five of the comparison matrix at $t_2$ is equal to row three of the comparison matrix latches at $t_0$ and that the phantom row four at $t_2$ is equal to row three of the comparison matrix latches at $t_1$.

By performing certain preliminary calculations of the error value calculations at $t_0$ and $t_1$, the pixel values in phantom rows 222, 224, 226, and 228 are not required at $t_2$. These preliminary error calculations determine the error contribution of each group of three horizontally adjacent pixels. For example, let us examine the error value computation of the subset in the upper right corner of the window matrix, which equals: $[W(1;7)-C(3;5)]^2+[W(2;7)-C(4;5)]^2+[W(3;7)-C(5;5)]^2+[W(1;6)-C(3;4)]^2+[W(2;6)-C(4;4)]^2+[W(3;6)-C(5;4)]^2+[W(1;5)-C(3;3)]^2+[W(2;5)-C(4;3)]^2+[W(3;5)-C(5;3)]^2$, where W denotes the window matrix and C denotes the comparison matrix. However, this error value is identically equal to: $[W(1;5)-C(3;3)]^2$ at $t_0+[W(2;5)-C(4;3)]^2$ at $t_0+[W(3;5)-C(5;3)]^2$ at $t_0+[W(1;5)-C(3;3)]^2$ at $t_1+[W(2;5)-C(4;3)]^2$ at $t_1+[W(3;5)-C(5;3)]^2$ at $t_1+[W(1;5)-C(3;3)]^2$ at $t_2+[W(2;5)-C(4;3)]^2$ at $t_2+[W(3;5)-C(5;3)]^2$ at $t_2$. Thus by summing the preliminary calculations of the sum of the squares of the differences between three horizontally adjacent pixels of the window matrix latches and the three pixels of row three of the comparison matrix latches at three consecutive times, the error values of the three by three subsets of the window matrix may be calculated. Therefore, the inputs to the twenty-five subset difference computation circuits 210, 212, and 214 (FIG. 9) are the two bit values of the three pixels in row three of the comparison matrix latches 206 and the two bit values of the three pixels of each of the twenty-five combinations of three horizontally adjacent pixels within the window matrix latches 204.

FIG. 11 illustrates the interconnection of the five latches 230, 232, 234, 236, and 238 of the window matrix latches 204. Latch 230 receives, from a corresponding pixel memory, the seven most significant bits (MSB) and the seven least significant bits (LSB) representing the seven pixels of row one. Once latched in by a pulse of the pixel clock, the pixel values of row one are input to latch 232 and to five subset difference computation circuits via bus 240. The outputs of latch 232 are input to latch 234 and to five additional subset difference computation circuits via bus 240. The most significant bits of the outputs of latches 230 and 232 are input to the dynamic threshold circuit 208 and are used to determine the presence of edges within the window matrix. Latches 234, 236, and 238 are cascaded together and are also connected to the subset difference computation circuits via bus 240.

FIG. 12 illustrates the interconnections of latches 242, 244, and 246 that form the comparison matrix latches 206. Latch 242 receives, from the opposite pixel memory, the three most significant bits and the three least significant bits representing row one pixels in columns three, four, and five. Latches 242, 244, and 246 are cascaded together such that the pixel values transfer to latch 244 and then to latch 246 upon pulses of the pixel clock.

Figure 13:
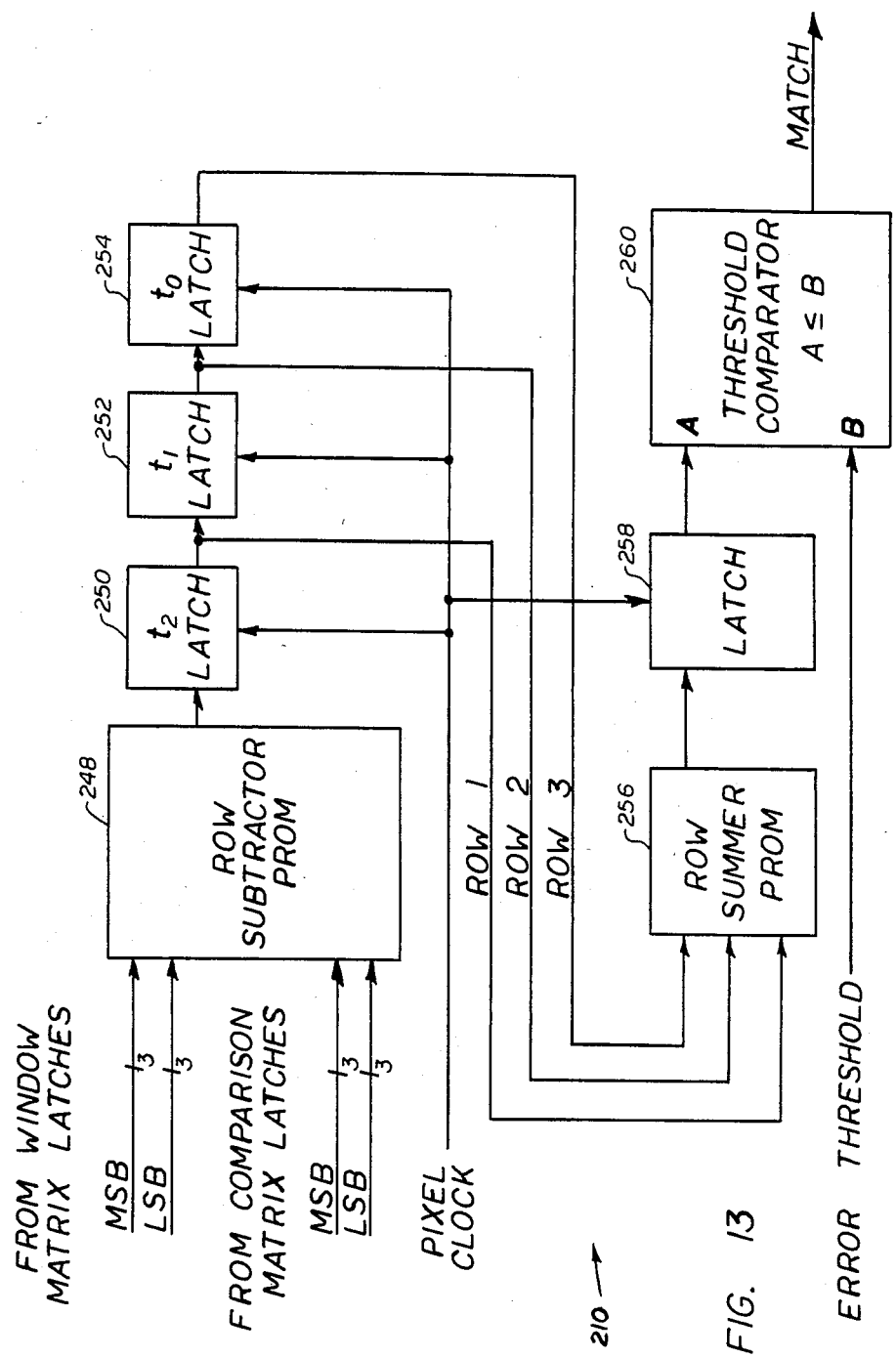
FIG. 13 is a block diagram of a subset difference computation circuit utilized in the defect detection circuit of FIG. 8.

In FIG. 13, the circuitry of a representative subset difference computation circuit 210. Three MSB and three LSB for three horizontally adjacent pixels of the window matrix plus three MSB and three LSB for the row three pixels of the comparison matrix form twelve address lines for a row subtractor PROM 248. Stored at the 2$^{12}$ memory cells of PROM 248 are the results of the preliminary error calculation described above: $[W(1)-C(1)]^2+[W(2)-C(2)]^2+[W(3)-C(3)]^2$. The implementation of this calculation in a PROM device is advantageous in reducing the amount of circuitry and improving the speed of circuit 210. The output of the row subtractor PROM 248 is input to a $t_2$ latch 250, which is cascaded with a $t_1$ latch 252 and a $t_0$ latch 254. In response to pulses of the pixel clock, the preliminary error calculation results are shifted between latches 250, 252, and 254. The preliminary error calculation results of three consecutive time periods that are stored in latches 250, 252, and 254 are input to a row summer PROM 256. The values stored in latches 250, 252, and 254 act as addresses to access memory cells of the row summer PROM 256. Stored in the memory cells of PROM 256 are error values that are equal to the sums of the preliminary error calculation results. Thus, PROM 256 is operable for summing the three preliminary error results stored in latches 250, 252, and 254. The output of PROM 256 is stored in latch 258 and is compared to the error threshold value by a threshold comparator 260. If the error value thus calculated is less than or equal to the error threshold value, a match (no defect) is indicated.

Figure 14:
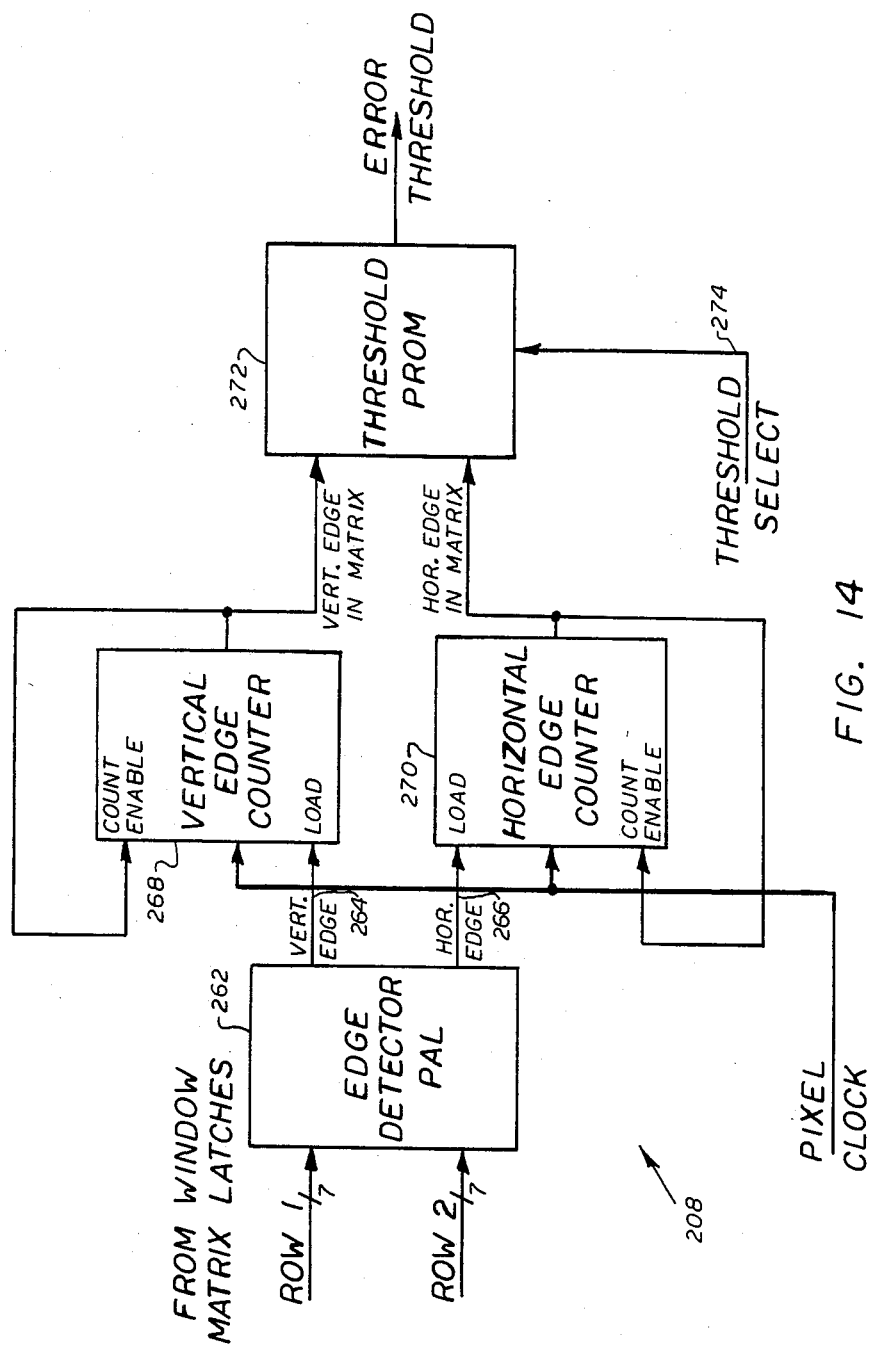
FIG. 14 is a block diagram of a dynamic threshold circuit utilized in the defect detection circuit of FIG. 8.

The magnitude of the error threshold value is determined by the dynamic threshold circuit illustrated in FIG. 14. The most significant bits (MSB) from the fourteen pixels in rows one and two of the window matrix latches 204 are input to an edge detector PAL (programmable array logic) 262. The PAL is programmed to return a logic high value on a vertical edge output port 264 if there is a vertical edge within rows one and two, and to return a logic high value on a horizontal edge output port 266 if there is a horizontal edge within rows one and two. A vertical edge is indicated if any two horizontally adjacent pixels are different in value. A horizontal edge is indicated if any two vertically adjacent pixels are different in value.

Once an edge is found in rows one and two, it will be within the window matrix for at least seven periods of the pixel clock. Two down counters 268 and 270 are utilized to count down from seven once an edge is found. The outputs of counters 268 and 270 are fed back to count enable inputs to prevent the counters from passing zero.

Outputs from the down counters 268 and 270 indicate whether there is a vertical or horizontal edge within the window matrix. These outputs serve as address inputs to a threshold PROM 272 to determine the error threshold value. In addition, an operator may direct the threshold PROM through a threshold select line 274 to select a certain error threshold value.

Although the present invention has been described above in terms of a preferred embodiment specifically designed to detect defects in photomasks, it will be understood that the apparatus or various parts thereof could be adapted for other applications. For example, the source of one of the pixel representations may be a stored database, rather than an optically and electronically measured die pattern. Additionally the invention could be used to inspect metal masks and reticles. Alterations and modifications may be made to the disclosed embodiment without departing from the inventive concept thereof. For example, the window matrices may be eight by eight pixels and the comparison matrices may be four by four pixels, without departing from the inventive concept. For another example, the pixel values may be four bit binary numbers (or any other number) instead of two bit, also without departing from the inventive concept. Accordingly, it is Applicants' intent that the appended claims be interpreted as covering all such alterations, modifications, or other applications as fall within the true scope of the invention.

We claim:

1. A method for detecting defects in a reticle, a metal mask, or other object such as a photomask having a plurality of duplicate two-dimensional patterns thereon, said method being operable for comparing two like patterns and for indicating defects wherever said patterns do not match, said method comprising the steps of:

forming a first representation of a first of said patterns and a second representation of a second of said patterns for comparison to said first representation, each of said patterns being represented by and each of said representations being composed of a two-dimensional array of uniformly spaced apart pixels having relative positions that correspond to spatial positions on the object being inspected, each pixel having a value that indicates the absence or presence of said pattern at the spatial position represented by that pixel;

forming a first comparison matrix of a group of adjacent pixels of said first representation, and forming a first window matrix of a group of adjacent pixels of said second representation, the pixels of said first comparison matrix representing an area of said first pattern that corresponds to a like area of said second pattern that is contained within the area represented by the pixels of said first window matrix, said first comparison matrix being smaller in extent that said first window matrix, said first window matrix having subsets of adjacent pixels that are equivalent in relative orientation to said first comparison matrix and equal in number to the number of unique positions that said first comparison matrix could be positioned within said first window matrix;

forming a second comparison matrix of a group of adjacent pixels of said second representation, and forming a second window matrix of a group of adjacent pixels of said first representation, the pixels of said second comparison matrix representing an area of said second pattern that corresponds to a like area of said first pattern that is contained within the area represented by the pixels of said second window matrix, said second comparison matrix being smaller in extent than said second window matrix, said second window matrix having subsets of adjacent pixels that are equivalent in relative orientation to said second comparison matrix and equal in number to the number of unique positions that said second comparison matrix could be positioned within said second window matrix;

computing first error values that are proportional to the magnitude of the difference between the pixel values of equivalently oriented pixels of said first comparison matrix and said subsets of said first window matrix;

computing second error values that are proportional to the magnitude of the difference between the pixel values of equivalently positioned pixels of said second window matrix and said subsets of said second window matrix;

comparing said first error values to a first error threshold value, and determining that there exists no defect in said first pattern within the area represented by the pixels of said first comparison metrix if at least one of said first error values is less than said first error threshold value; and comparing said second error values to a second error threshold value, and determining that there exists no defect in said second pattern within the area represented by the pixels of said second comparison matrix if at least one of said second error values is less than said second error threshold value.

2. A method as recited in claim 1 additionally repeating said steps of forming first and second comparison matrices, computing first and second error values therefor, and comparing said error values to error threshold values until the entire area of said first and second representation has been covered.

3. A method as recited in claim 1 wherein said pixels are square in shape, and said first and second comparison and window matrices are also square in shape.

4. A method as recited in claim 3 wherein said first and second window matrices each have seven rows and seven columns of adjacent pixels and said first and second comparison matrices each have three rows and three columns of adjacent pixels.

5. A method as recited in claim 3 wherein said first comparison matrix is centered within said second window matrix, and said second comparison matrix is centered within said first window matrix.

6. A method as recited in claim 1 wherein said pixel values vary from a maximum value indicating the absence of said pattern at said spatial position represented by said pixel to a minimum value indicating the presence of said pattern at said spacial position.

7. A method as recited in claim 6 wherein said pixel values also include intermediate values indicating the presence of a pattern edge at said spatial position represented by said pixel.

8. A method as recited in claim 1 wherein said step of computing said first error values includes computing a first error value for each subset of said first window matrix, each subset having a first error value equal to the sum of the squares of the differences between the pixel value of each of the pixels of said first comparison matrix and the pixel value of the equivalently oriented pixel of said subset.

9. A method as recited in claim 1 wherein said step of computing said second error values includes computing a second error value for each subset of said second window matrix, each subset having a second error value equal to the sum of the squares of the differences between the pixel value of each of the pixels of said second comparison matrix and the pixel value of the equivalently oriented pixel of said subset.

10. A method as recited in claim 1 wherein said first and second error threshold values are variable and are a function of the number and type of edges or other feature of said first and second patterns respectively within said first and second window matrices.

11. A method as recited in claim 10 wherein said first error threshold value equals a minimum value when there are no pattern edges within said first window matrix, said first error threshold value equals a maximum value when there are two types of pattern edges within said first window matrix, and said first error threshold value equals an intermediate value when there is one type of pattern edge within said first window matrix, and wherein said second error threshold value equals said minimum value when there are no pattern edges within said second window matrix, said second error threshold value equals said maximum value when there are two types of pattern edges within said second window matrix, and said second error threshold value equals said intermediate value when there is one type of pattern edge within said second window matrix.

12. A method as recited in claim 1 wherein said patterns are opaque areas in an otherwise transparent object, and said step of forming said first representation of said first pattern and said second representation of said second pattern includes the steps of:

projecting images of portions of said first pattern onto a first one-dimensional array of uniformly spaced apart sensors and projecting images of portions of said second pattern onto a second one-dimensional array of uniformly spaced apart sensors, each of said sensors being operable for detecting opaque and transparent portions of said patterns and also operable for generating sensor signals indicative of the presence of an opaque or transparent portion of said pattern in the image projected thereupon;

recording said sensor signals respectively into first and second pixel memories;

moving said patterns in a direction perpendicular to the length of said sensors to project adjacent portions of said patterns onto said sensors;

recording said sensor signals that correspond to said adjacent portions of said patterns into said pixel memories; and repeating the previous two steps of moving said patterns and recording said sensor signals for each adjacent portion of said patterns until complete representations of said patterns have been formed and recorded in said pixel memories.

13. A method as recited in claim 12 wherein:

said step of projecting images of portions of said patterns is accomplished by optical lens means;

said patterns are illuminated from the side opposite said sensors such that light passing through the transparent areas is projected onto said sensors, and light incident upon the opaque areas is blocked from reaching said sensors; and said sensors are photodiodes that are responsive to the intensity of light incident thereupon.

14. A method as recited in claim 12 wherein said step of forming said first comparison and window matrices and of computing first error values occurs concurrently with said steps of moving said patterns and recording said sensor signals.

15. Inspection apparatus for locating and identifying defects in a photomask having multiple die patterns thereon, said apparatus comprising:

carriage means for supporting the photomask and for moving said photomask along an inspection path;

illumination means for illuminating portions of said photomask as it is moved along said inspection path;

optical means for focusing images of portions of two die patterns at a focal plane;

first and second photosensitive detector means disposed at said focal plane for generating first and second sensor signals indicative of the images of said die patterns incident thereon; and signal processing means for processing said first and second sensor signals to locate and identify defects in said die patterns by finding differences between said first and second sensor signals, said signal processing means including;

first and second pixel memory means for storing said first and second sensor signals to form first and second pixel representations of said die patterns, defect detection means for finding portions of said first and second representations that do not match sufficiently to indicate defects, said defect detection means having area subtraction means for computing error values that are proportional to the differences in the sensor signal magnitudes between corresponding portions of said first and second pixel representations, and having threshold comparison means for evaluating the magnitude of said error values to determine the existence of defects, error threshold calculation means for determining threshold values used by said threshold comparison means in the determination of defects, said error threshold calculation means being operable for increasing defect detection sensitivity in areas not prove to false error detection, and for decreasing defect detection sensitivity in other areas to minimize the detection of misalignment errors as defects, microprocessor means for controlling said signal processing means, and input/output means for communication of defect information and inspection results.

16. Inspection apparatus for locating and identifying defects in an object such as a reticle, a photomask with multiple openings therein, or a photomask having multiple die patterns thereon, said apparatus comprising:

carriage means for supporting the object and for moving said object along an inspection path;

illumination means for illuminating a portion of said object as it is moved along said inspection path;

optical means for focusing an image of a portion of an object pattern at a focal plane;

first photosensitive detector means disposed at said focal plane for generating a first sensor signal indicative of the image of said object pattern incident thereon;

data base means having pattern data stored therein corresponding to the image patterns of said object, said pattern data being selectively output in the form of second sensor signals corresponding to said first sensor signals; and signal processing means for processing said first and second signals to locate and identify defects in said object pattern by finding differences between said first and second sensor signals, said signal processing means including;

first and second pixel memory means for storing said first and second sensor signals to form first and second pixel representations of said object pattern and said pattern data, defect detection means for finding portions of said first and second pixel representations that do not match sufficiently to indicate defects, said defect detection means having area subtraction means for computing error values that are proportional to the differences in the sensor signal magnitudes between corresponding portions of said first and second pixel representations, and having threshold comparison means for evaluating the magnitude of said error values to determine the existence of defects, error threshold calculation means for determining threshold values used by said threshold comparison means in the determination of defects, said error threshold calculation means being operable for increasing defect detection sensitivity in areas not prove to false error detection, and for decreasing defect detection sensitivity in other areas to minimize the detection of misalignment errors as defects, microprocessor means for controlling said signal processing means, and input/output means for communication of defect information and inspection results.

17. A method is recited in claim 10 wherein said first and second threshold values are selectable from sets of predetermined values and are selected by an operator input threshold select signal.

* * * * *